United States Patent
Ono

(10) Patent No.: US 7,228,510 B2
(45) Date of Patent: Jun. 5, 2007

(54) SEMICONDUCTOR INTEGRATED CIRCUIT DEVICE AND ITS MANUFACTURE USING AUTOMATIC LAYOUT

(75) Inventor: Yukichi Ono, Hamamatsu-shi (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 10/953,309

(22) Filed: Sep. 29, 2004

(65) Prior Publication Data

US 2005/0040435 A1    Feb. 24, 2005

Related U.S. Application Data

(62) Division of application No. 10/697,074, filed on Oct. 30, 2003, now Pat. No. 7,053,424.

(30) Foreign Application Priority Data

Oct. 31, 2002    (JP)    ............................. 2002-316997

(51) Int. Cl.
*G06F 17/50*    (2006.01)
(52) U.S. Cl. ......................................... 716/2; 257/206
(58) Field of Classification Search .................... 716/2; 257/206
See application file for complete search history.

(56) References Cited

U.S. PATENT DOCUMENTS

| 5,187,668 A | * | 2/1993 | Okude et al. ................... 716/8 |
| 5,852,562 A | * | 12/1998 | Shinomiya et al. ............ 716/10 |
| 6,513,147 B1 | * | 1/2003 | Nakatsu et al. ................. 716/8 |
| 2001/0049815 A1 | * | 12/2001 | Shinomiya et al. ............ 716/11 |

FOREIGN PATENT DOCUMENTS

| JP | 06-085062 | 3/1994 |
| JP | 06-085064 | 3/1994 |

* cited by examiner

*Primary Examiner*—Nathan W. Ha
*Assistant Examiner*—Abul Kalam
(74) *Attorney, Agent, or Firm*—Pillsbury Winthrop Shaw Pittman LLP

(57) ABSTRACT

A semiconductor integrated circuit device has: a semiconductor substrate defining a plurality of rows, each row including areas for a sequence of cells; a plurality of active regions disposed in each of the rows constituting semiconductor elements of associated cells; and a wiring region of stripe shape elongated along a direction of row, defined on the semiconductor substrate outside of the active regions in each row, and including wirings belonging to the associated cells, each wiring region having height in a direction crossing the row direction, the wiring region having locally different height.

18 Claims, 11 Drawing Sheets

SEMICONDUCTOR INTEGRATED CIRCUIT DEVICE AND ITS MANUFACTURE USING AUTOMATIC LAYOUT

RELATED APPLICATIONS

This application is a divisional application of U.S. patent application Ser. No. 10/697,074, filed Oct. 30, 2003.

CROSS REFERENCE TO RELATED APPLICATION

This application is based on and claims priority of Japanese Patent Application No. 2002-316997 filed on Oct. 31, 2002, the entire contents of which are incorporated herein by reference.

BACKGROUND OF THE INVENTION

A) Field of the Invention

The present invention relates to a semiconductor integrated circuit device and its manufacture, and more particularly to a semiconductor integrated circuit device capable of being designed with automatic layout and its manufacture.

B) Description of the Related Art

It is desired to develop in a short time semiconductor integrated circuit devices of various types and small quantity. A semiconductor integrated circuit device can be designed by automatic layout using a computer. In a standard cell method, patterns of basic gates and frequently used logic circuits are registered beforehand as standard cells. Automatic layout design is performed by disposing standard cells and wirings between cells in accordance with an equivalent circuit of a semiconductor integrated circuit device to be manufactured. Wiring regions are prepared in each cell. Some of interconnect wirings and power supply wirings in a cell may be prepared beforehand.

In automatic layout for a CMOS integrated circuit, n-type active regions for n-channel MOS transistors and p-type active regions for p-channel MOS transistors are disposed in a column along a width direction. Each cell has a constant height along a direction perpendicular to the width (column) direction. If the height is fixed, wasteful space is likely to be formed so that the effective use of a substrate area may be hindered.

Japanese Patent Laid-open Publication No. 6-85062 proposes an optimum cell layout by using variable height of wiring regions for inter-cell wirings in the cells. Wiring regions are disposed above a semiconductor active region, above the semiconductor active region and isolation region and the like. This Publication also proposes a broad wiring region formed by connecting wiring regions above the p- and n-type active regions and common wirings formed in the broad wiring region.

Japanese Patent Laid-open Publication No. HEI4-263059 proposes that circuit information is developed into wiring information, single transistor cell information, serial cell information on a serial connection of a plurality of transistors and parallel cell information on a parallel connection of a plurality of transistors, respectively for n- and p-channel transistors. In a central area of a semiconductor chip, columns of n-type active regions and columns of p-type active regions are alternately disposed and a wiring region is disposed between adjacent active regions. Peripheral circuits are disposed in chip peripheral areas. Transistors having different channel lengths are distinguished from each other, making the size (channel length) of the column variable.

By making variable the height of a column of aligned cells, the substrate area can be used effectively. However, a wasteful space is formed in the substrate area if the numbers of wirings in cells along a column are large in some cells and small in some cells or by other reasons.

SUMMARY OF THE INVENTION

An object of this invention is to provide a semiconductor integrated circuit device capable of automatic layout and effective use of a substrate area.

Another object of this invention is to provide a semiconductor integrated circuit device capable of automatic layout and an improved integration density.

Still another object of this invention is to provide a manufacture method for a semiconductor integrated circuit device capable of eliminating a wasteful space as much as possible by automatic layout and effectively using a substrate area.

Still another object of this invention is to provide an automatic layout method for a semiconductor integrated circuit device having a high integration density.

According to one aspect of the present invention, there is provided a semiconductor integrated circuit device comprising: a semiconductor substrate defining a plurality of rows, each row including areas for a sequence of cells; a plurality of active regions disposed in each of said rows constituting semiconductor elements of associated cells; a wiring region of stripe shape elongated along a direction of row, defined on said semiconductor substrate outside of said active regions in each row, and including wirings belonging to the associated cells, each wiring region having height in a direction crossing the row direction, the wiring region having locally different height.

According to another aspect of the present invention, there is provided a method of manufacturing a semiconductor integrated circuit device comprising the steps of: (a) decomposing circuit data into cells, and reading cell data including configuration data and interconnection data, from registered standard cell library; (b) locating cells on a semiconductor substrate in a plurality of rows, each of said rows including a plurality of cells aligned along the direction of row, each cell comprising active regions, shape-fixed wiring region disposed over the active region, and shape-variable wiring region disposed outside the active regions and having height along a direction crossing a direction of said row; (c) designing layout of wirings in said shape-fixed wiring region; (d) designing layout of wirings in said shape-variable wiring region; (e) checking possible variation of wirings in said shape-variable wiring region which can reduce a distance between a pair of cells; and (f) if there is a variation which can reduce the distance between said pair of cells, redesigning the layout of wirings in the shape-variable wiring region.

According to still another aspect of the present invention, there is provided a method of automatically designing layout of a semiconductor integrated circuit device comprising the steps of: (a) decomposing circuit data into cells, and reading cell data including configuration data and interconnection data, from registered standard cell library; (b) locating cells on a semiconductor substrate in a plurality of rows, each of said rows including a plurality of cells aligned along direction of row, each cell comprising active regions, shape-fixed wiring region disposed over the active region, and shape-variable wiring region disposed outside the active regions and having height along a direction crossing the direction of row; (c) designing layout of wirings in said shape-fixed wiring region; (d) designing layout of wirings in said shape-variable wiring region; (e) checking possible variation of wirings in said shape-variable wiring region which can reduce a distance between a pair of cells; and (f) if there is a variation which can reduce the distance between said pair of cells, redesigning the layout of wirings in the shape-variable wiring region.

As above, the shape of a shape-variable wiring region is determined based upon cell layout information and wiring information and a wiring pattern is determined automatically. Accordingly, the area of an integrated circuit can be effectively used and a high integration density can be attained.

DESCRIPTION OF THE PREFERRED EMBODIMENTS

Figure 1:
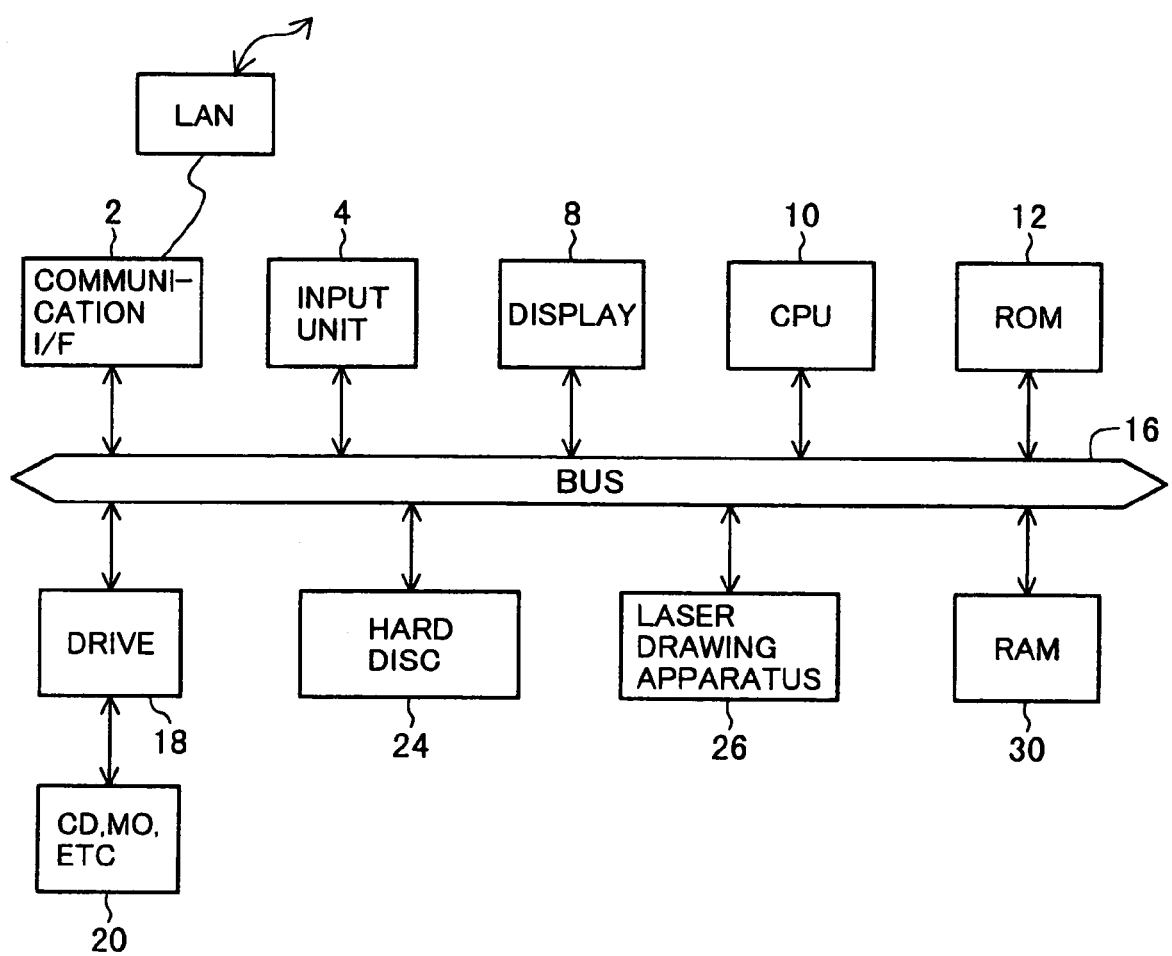
FIG. 1 is a block diagram of an automatic layout wiring system.

With reference to FIG. 1, the structure of an automatic layout wiring system will be described. The automatic layout wiring system is made of a general computer and an application program to be run on the general computer.

Referring to FIG. 1, a communication interface 2 is used for transferring layout wiring data and the like to and from another system via a local area network (LAN). An input unit 4 may be an alphanumeric input keyboard, a mouse, a pattern drawing digitizer or the like. A display unit 8 displays various information for users. A CPU 10 performs logical computation in accordance with a program and controls other constituent units via a bus 16. A ROM 12 stores an initial program loader and the like of the automatic layout wiring system. A removable disk drive 18 performs data read/write of a removable disk 20 such as CD-ROM, MO and the like.

A hard disk 24 stores an operating system for the computer, application programs, layout wiring data and the like for the automatic layout wiring system. A laser drawing apparatus 26 draws a created layout wiring pattern on a photosensitive member. The photosensitive member may be a reticle or its original image for forming an integrated circuit photoresist mask, or a resist mask itself. A RAM 30 is used as a working memory of CPU 10.

Description will be made on the procedure of designing a semiconductor integrated circuit device by using the automatic layout wiring system shown in FIG. 1. Data of a circuit to be formed is assumed to be stored in advance in the hard disk 24. The circuit data is, for example, data describing an equivalent circuit at a fundamental logic gate level, such as an inverter, or data describing an equivalent circuit at a semiconductor element level, such as a transistor. The hard disk 24 stores also a cell information library including cell layout information of registered standard cells. A cell corresponds to a circuit block having a predetermined function, such as a flip-flop and a counter.

Figure 2:
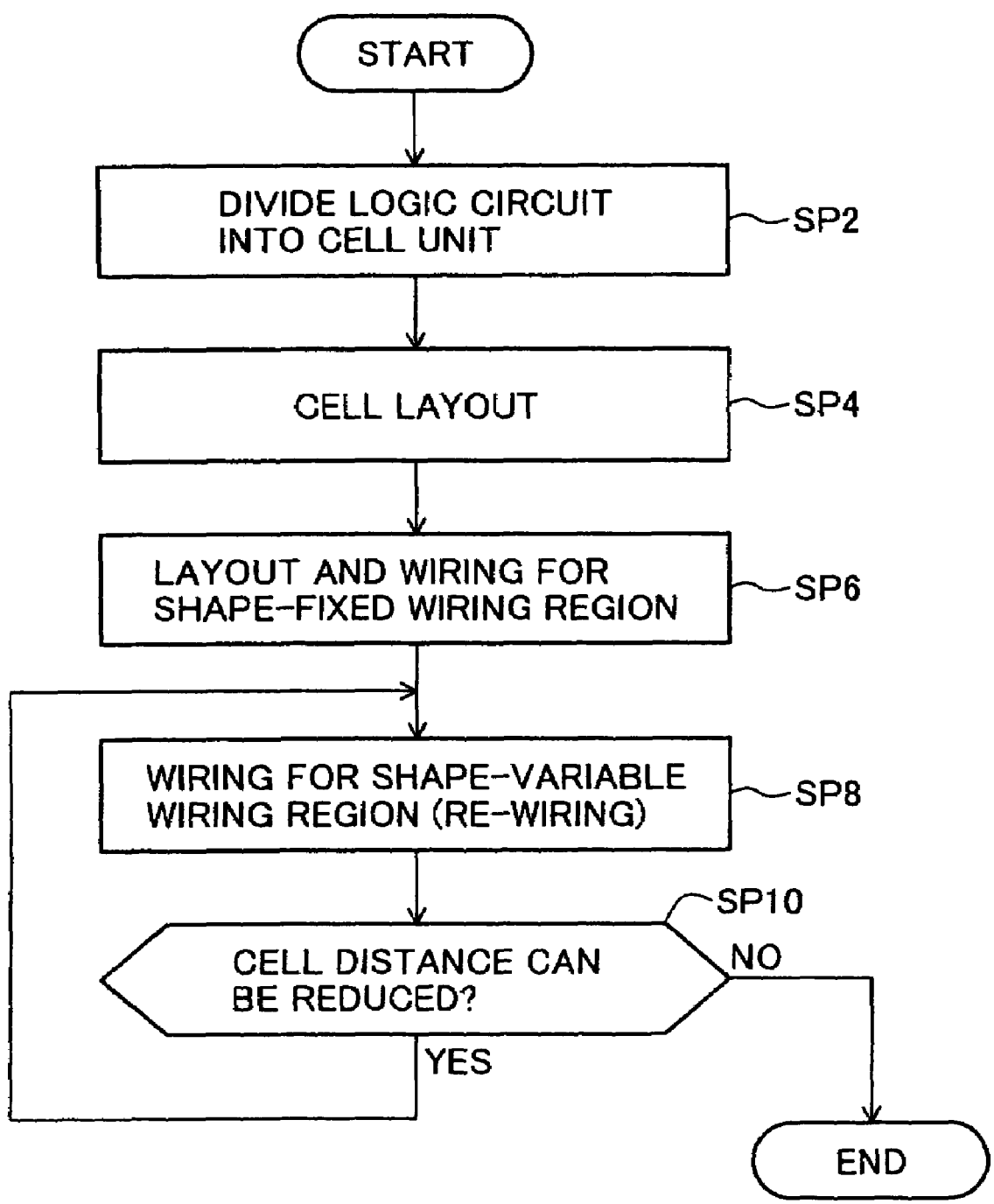
FIG. 2 is a flow chart illustrating a program to be executed by the automatic layout wiring system.

Referring to FIG. 2, as the procedure starts, circuit data is read at Step SP2 and divided into the unit of cell. A cell layout corresponding to each divided cell is selected to form cell information. The cell information includes wiring connection information on which node is connected to which node in each cell or between cells, and other information.

Figure 3A:
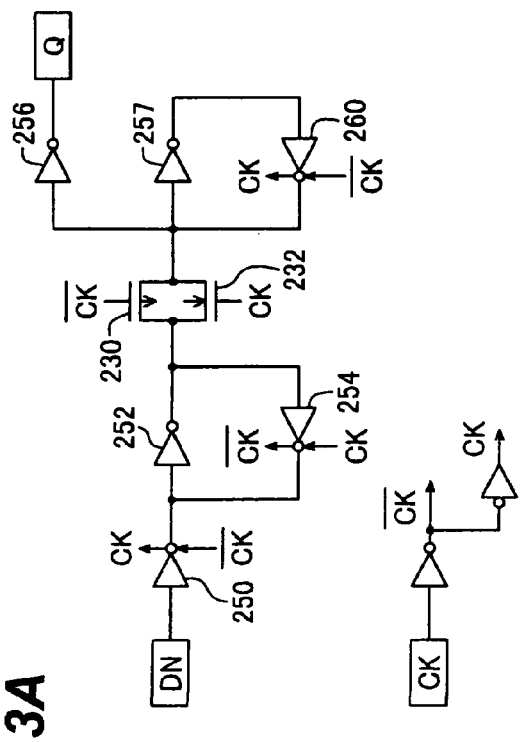
FIGS. 3A and 3B are equivalent circuits of a D-type flip-flop cell.

FIG. 3A is an equivalent circuit of a cell layout of a D-type flip-flop. The D-type flip-flop is constituted of inverters 250, 252, 254, 256, 257 and 260 and transistors 230 and 232.

Figure 3B:
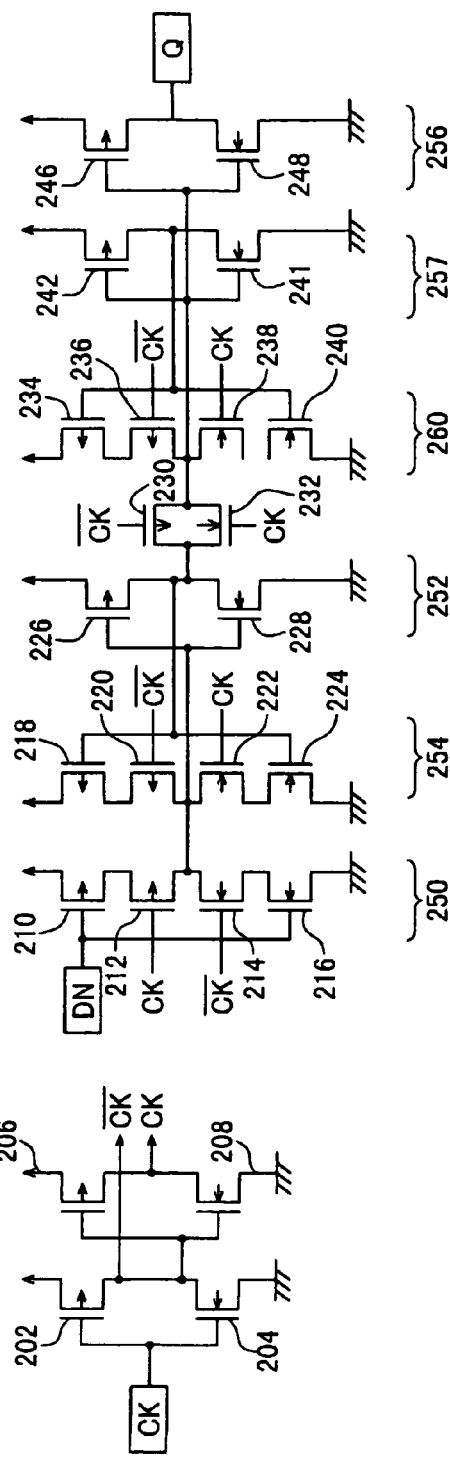

FIG. 3B is an equivalent circuit of the D-type flip-flop shown in FIG. 3A at a semiconductor element level. Transistors 202 to 228, 234 to 248 constitute the inverters 250 to 260.

The cell layout defines an active region and a gate electrode of each semiconductor element in the cell and fixed wirings such as local interconnects. Intra-cell wirings and inter-cell wirings are provided only with circuit connection information and their layout is not still definite. This information is stored as cell information.

At Step SP4 shown in FIG. 2, cells are laid out on a semiconductor chip. A plurality of column regions can be defined in a central area of the semiconductor chip, and a sequence of cell regions can be disposed along each column.

Figure 4:
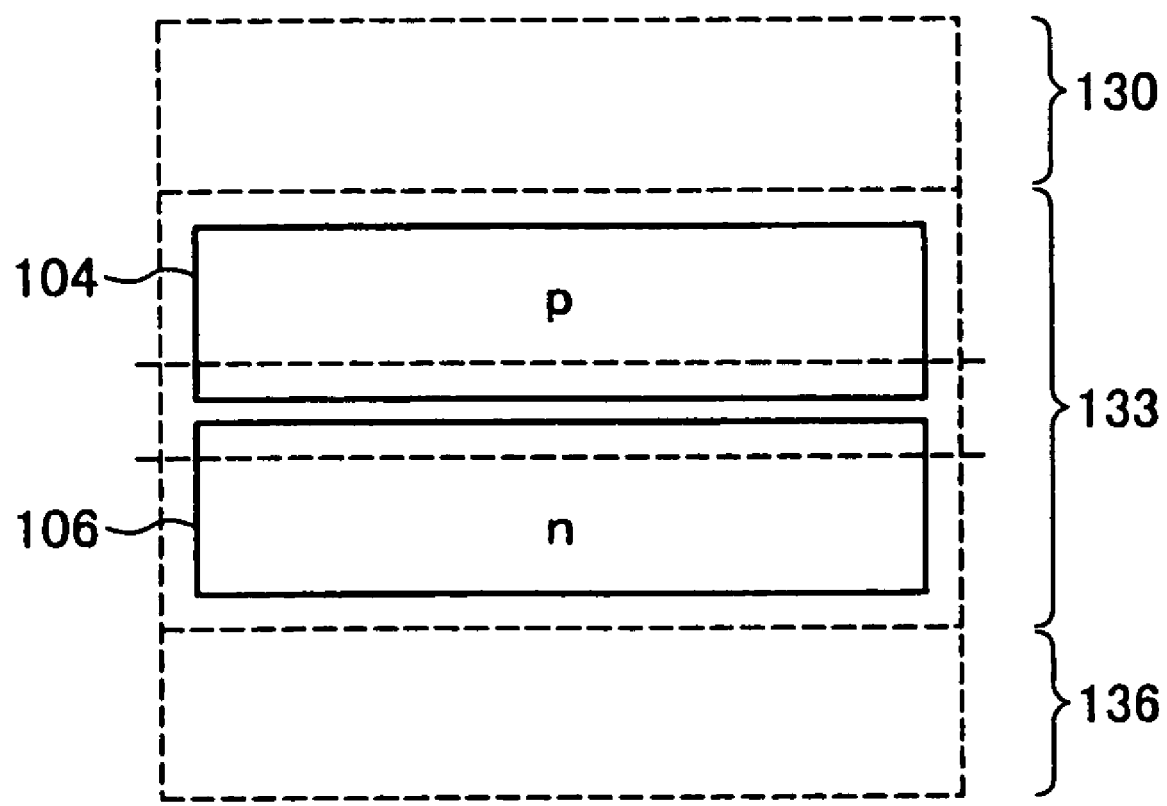
FIG. 4 is a plan view of a cell region.

With reference to FIG. 4, the structure of a cell will be described. On a semiconductor substrate, a p-type diffusion layer 104 and an n-type diffusion region 106 are disposed near each other. In the example shown in FIG. 4, the p-type diffusion layer 104 and n-type diffusion layer 106 include three regions divided by an isolation region. The number of active regions may be increased or decreased as desired depending upon a cell. The width of the isolation region between the p-type and n-type diffusion regions is selected to have a such width capable of forming one wiring contact for example. Wirings are formed above the diffusion layer. The wiring region is divided into a shape-fixed wiring region 133 whose shape and area are fixed and shape-variable wiring regions 130 and 136 whose shape and area are variable. Some of wirings such as power supply wirings may be preset in the shape-fixed wiring region 133. The shape-fixed wiring region 133 is one region disposed, for example, covering both the diffusion layers 104 and 106. The shape-fixed wiring region 133 may be disposed independently on the p-type diffusion region 104 and n-type diffusion region 106. Each of the shape-variable wiring regions 130 and 136 has a sufficiently broad rectangular region as a default and is disposed outside of the shape-fixed wiring region. The shape-variable wiring regions 130 and 136 have a constant height common to cells in the column. Cells having such a shape are sequentially disposed along the lateral direction in FIG. 4 to form a column. A plurality of columns are disposed along the vertical direction.

At Step SP6 a wiring pattern in the shape-fixed wiring region 133 is determined. At least some of wirings to be disposed in the shape-fixed wiring region 133 may be preset, excepting wirings between cells and the like, to adopt this layout information at Step SP6.

Each circuit of an integrated circuit device is made of semiconductor elements such as transistors and wirings formed above the elements, respectively formed on a semiconductor substrate. Semiconductor elements such as transistors are formed by using diffusion layers formed in the semiconductor substrate. The periphery of the diffusion layer is surrounded by an isolation region made of silicon oxide or the like. In forming a transistor, a gate insulating layer is formed on the diffusion layer and a gate electrode of polysilicon or the like is formed on the gate insulating layer.

Wirings are made of a polysilicon layer same as that of the gate electrode or wiring layers formed above the polysilicon layer through an insulating layer. Although not limitative, the metal wiring layer is made of Al or Cu, and wiring layers are often disposed as a multi-level wiring structure having three to eight layers. The wiring layer can be disposed both above the diffusion layer and on the isolation region. Wirings include essential wirings such as power supply wirings and signal wirings for each cell and optional wirings such as interconnect wirings for each combination of cells. Regions for disposing these wirings are prepared beforehand. As described above, the wiring region is divided into the shape-fixed wiring regions whose shape including its size is fixed and the shape-variable wiring regions whose shape is variable. The shape-fixed wiring region is defined covering the active layers. The shape-variable wiring region is defined outside of the active layer, having a constant height in each column.

Figure 5A:
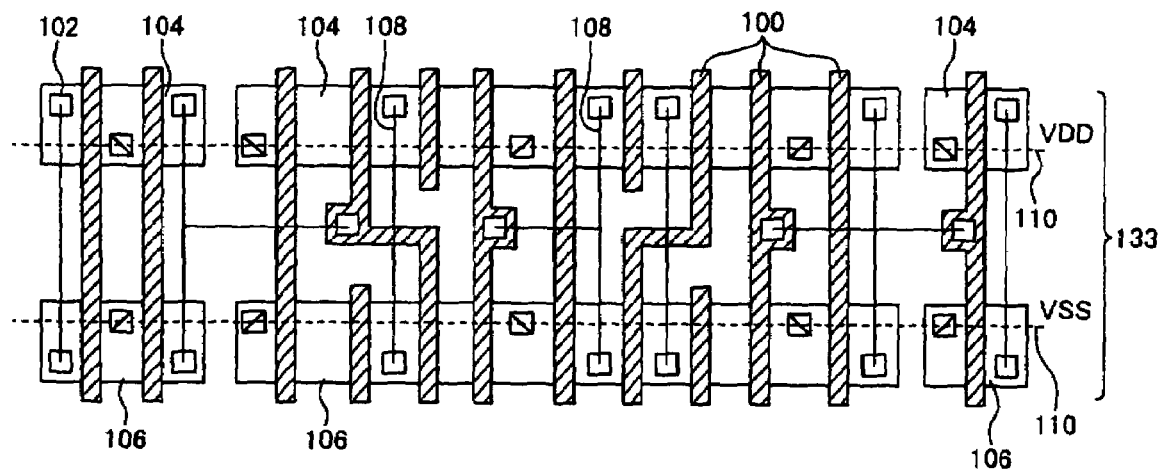
FIGS. 5A to 5N are plan views showing wiring patterns in a cell region.

FIG. 5A shows an example of a cell layout on a semiconductor substrate and a wiring layout in the shape-fixed wiring region above the cell layout. In FIG. 5A, p-type diffusion layers 104 and n-type diffusion layers 106 are disposed in separate three regions. On these regions, gate insulating layers are formed, and on the gate insulating layers, polysilicon wiring layers 100 forming gate electrodes of MOS transistors are formed. A plurality of metal wiring layers are formed above the polysilicon wiring layers. In the example shown in FIG. 5A, first metal wiring layers 110 and second wiring metal layers 108 are formed above the polysilicon wiring layers 100. Although there are other wirings different from these wirings, the layout of other wirings is not still determined.

The first metal wiring layers 110 include power supply wirings VDD and VSS disposed in the horizontal direction in FIG. 5A. Other wirings may be formed by using the first metal wiring layer. Wirings capable of being formed by the first metal wiring layer are horizontal wirings because the power supply wirings extend long in the horizontal direction, or short wirings not crossing the power supply wirings. Wirings crossing the power supply wirings are formed by using the second metal wiring layer 108. For example, wirings between columns are formed by the second metal wiring layers 108. Contacts between the metal wiring layer and the diffusion region or lower level wiring layer are represented by rectangular symbols.

Figure 5B:
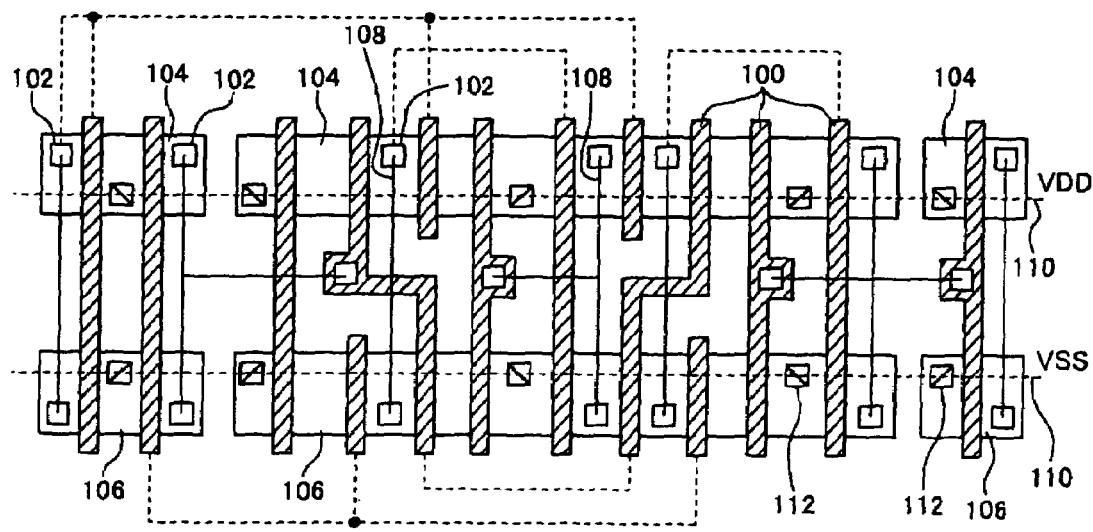

FIG. 5B shows shape-fixed wiring regions and interconnect wiring information contained in cell information. In the shape-fixed wiring region, the power supply wirings VDD and VSS are made of the first metal wiring layers 110. Some wirings in each cell are made of the second metal wiring layer. The interconnect wiring information represented by broken lines in the shape-variable wiring regions is wiring information belonging to cells and indicating which node in a cell is connected to which node. A cell having a predetermined function can be formed by using these wirings. A particular layout of these interconnect wirings is still not determined and only virtual or imaginary wirings are shown. Real wirings are formed when wirings between cells are formed.

Returning back to FIG. 2, at Step SP8 the wiring patterns in the shape-fixed wiring regions 130 and 136 are determined. Particular wiring layouts are determined in accordance with the intra-cell interconnect wiring information contained in the "cell information". At the time when Step SP8 is executed initially, the shape-variable wiring regions 130 and 136 have a sufficiently broad region. The wiring pattern can be determined for a general circuit configuration without any problem.

Figure 5C:
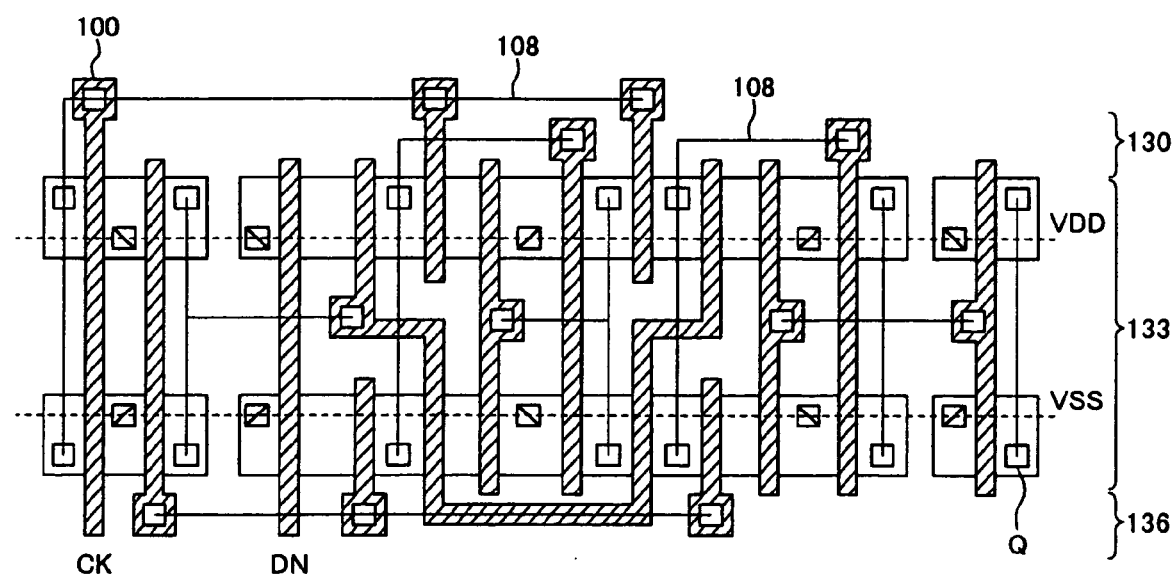

FIG. 5C shows an example of a particular wiring pattern of real wirings in the shape-fixed wiring region 133 and shape-variable wiring regions 130 and 136, including the polysilicon wirings 100, first metal wirings 110 and second metal wirings 108. Intra-cell wirings are formed by the polysilicon wirings 100 and second metal wirings 108, and power supply wirings are formed by the first metal wirings 110. Inter-cell wirings are also determined up to this Step SP8 in accordance with the circuit data. Inter-cell wirings may be disposed either in the shape-fixed wiring region or in the shape-variable wiring region. The number of metal wiring layers to be used is not limited to two layers, but three or more layers may be used.

In FIG. 5C, there are regions in an upper right area and in a lower right area where inter-cell wirings are not formed. These regions in the shape-variable wiring regions occupy wastefully the area of the semiconductor substrate. In the upper left region, two horizontal wirings are formed by the second wiring layer 108 so that the cell in this region is high.

Figure 5D:
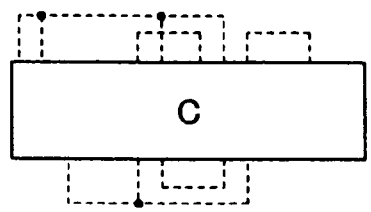

FIG. 5D shows a simplified layout of the layout shown in FIG. 5B. The shape-fixed wiring region is represented by a block C, and virtual wirings in the shape-variable wiring regions are represented by broken lines. Which wiring layer is used for virtual wirings is still not determined, and the broken lines are drawn without distinguishing between wiring layers.

Figure 5E:
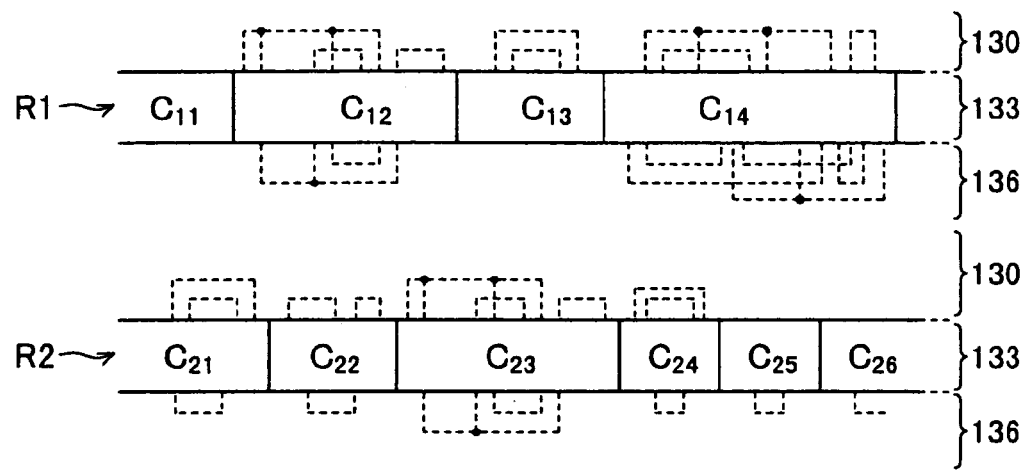

FIG. 5E shows an example of virtual wirings in adjacent cells. In the first column R1, blocks C11, C12, . . . are disposed horizontally. In the second column R2, blocks C21, C22, . . . are disposed horizontally. Each cell has the shape-fixed wiring region 133 in the block C and upper and lower shape-variable wiring regions 130 and 136. From these virtual wirings, the density of wirings (e.g., the number of wirings per unit region), the distribution of empty regions and the like can be estimated. By taking these information into consideration, the specific wiring layout is determined.

At Step SP10 shown in FIG. 2, it is judged whether a cell pitch (distance between blocks) of adjacent columns in the vertical direction can be reduced. The wiring region where no wiring is formed can be omitted without any problem. The cell height can be lowered by lowering the height of the shape-variable wiring region and deleting a wasteful area. Generally, in each column there are a region where a relatively large number of wirings are formed and a region where a relatively small number of wirings are formed. If the number of wirings in one of opposing shape-variable wiring regions in adjacent columns is small and that in the other of the regions is large, the distance between blocks can be reduced further by broadening one of the shape-variable wiring regions and narrowing the other without fixing the height of each column. In this case, the height of the shape-variable wiring region in the whole column is locally changed. The shape-variable wiring regions in adjacent columns are disposed mutually protruded and depressed. It is checked whether the distance between columns can be reduced by lowering the cell height or providing a mutually fitting state between opposing shape-variable wiring regions by changing the shapes of the shape-variable wiring regions. It is also checked whether the opposing cells can be made near to each other by changing the wiring layout. In some case, the column may be moved along the width direction.

Figure 5F:
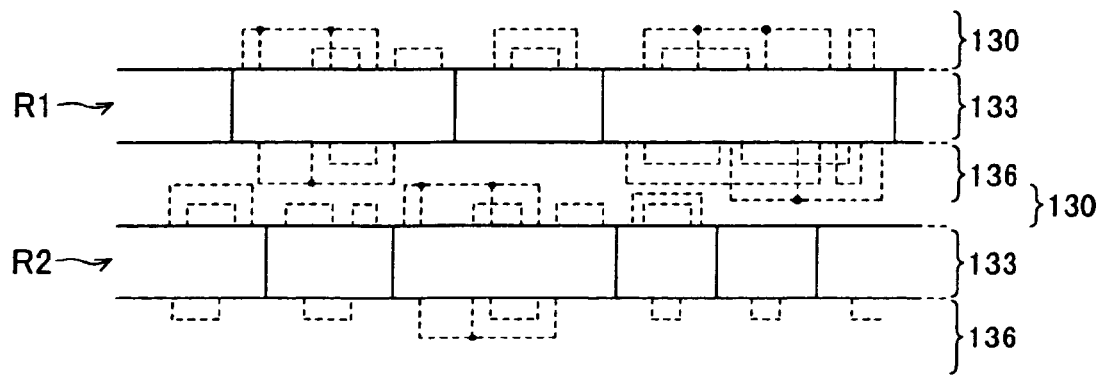

FIG. 5F shows an example of a wiring layout wherein adjacent columns are made as near as possible without fixing the height of the shape-variable wiring region of each column. A lower shape-variable wiring region 136 of the first column R1 and an upper shape-variable wiring region 130 of the second column R2 have a locally varied height instead of a fixed constant height and have a mutually fitting layout. As compared to the layout shown in FIG. 5E, it can be seen that the column pitch (distance between blocks C) is fairly reduced.

In the above processes, the inter-cell wirings are not taken into consideration on the assumption that they are designed in a separate way.

Figure 5G:
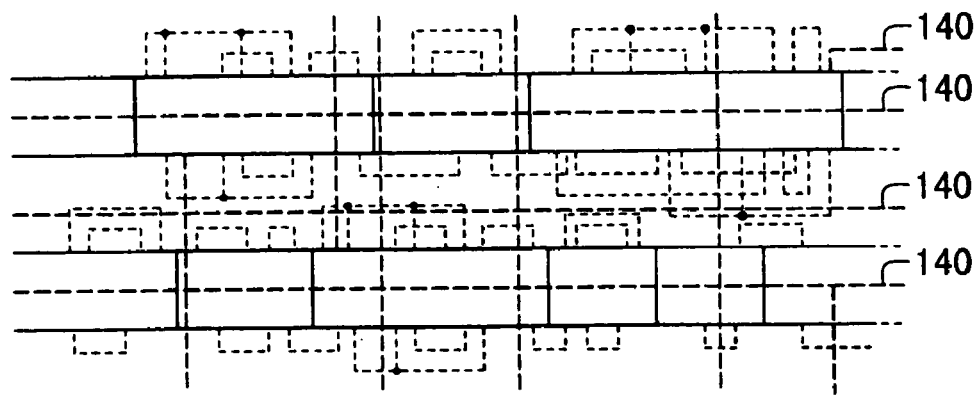
Figure 5H:
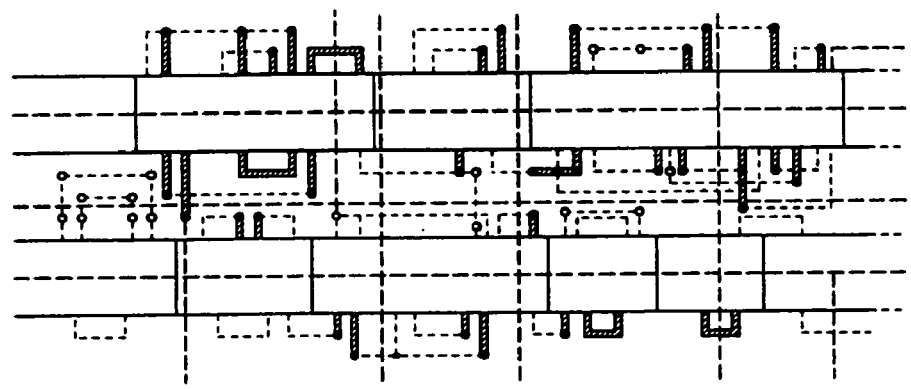

FIGS. 5G and 5H show an example of inter-cell wirings added to the wirings shown in FIG. 5E. Inter-cell wirings 140 are formed by a third wiring layer. FIG. 5H shows wiring layers and contacts in such a manner that they can be distinguished therebetween. The layout of inter-cell wirings in the shape-variable wiring region can be determined by considering the intra-cell wirings.

In this embodiment, three metal wiring layers are used. By combining different wiring layers, the height of the shape-variable wiring region can be lowered further. The inter-cell distance can be shortened further by changing the wiring layout by considering the wirings in the shape-variable wiring region of an adjacent cell. Description will be made on several alternatives for reducing an occupied substrate area.

Figure 5I:
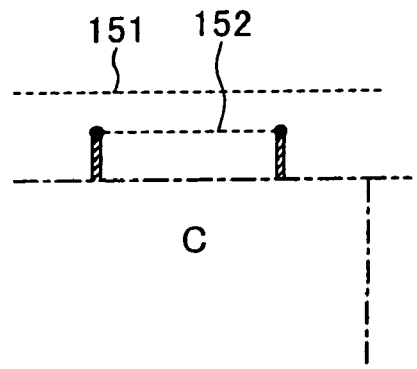

FIG. 5I shows two juxtaposed wirings 151 and 152 of the same wiring layer. The inner wiring 152 is a local short wiring connected to a polysilicon wiring, and the outer wiring 151 is relatively long. It is assumed herein that the cell height is constrained by the outer wiring 151 in an adjacent region.

Figure 5J:
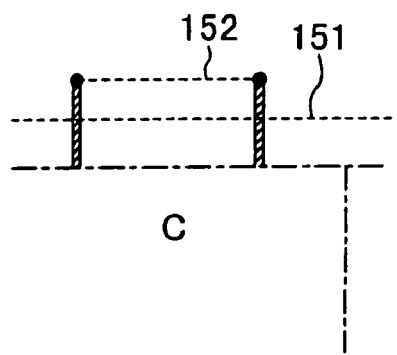

FIG. 5J shows a modification example. The polysilicon wiring is extended outside of the wiring 152. The wiring 151 can be displaced into an empty inner region. It is therefore easy to lower the cell height in the adjacent region. A similar modification is possible if two or more wiring layers are used.

Figure 5K:
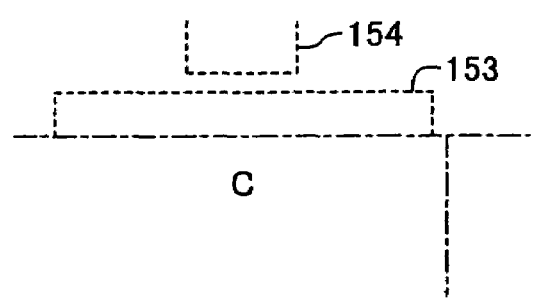

FIG. 5K shows the opposing layout of wirings 153 and 154 made of the same wiring layer (second wiring layer) of opposing cells. A predetermined distance or longer is required between the wirings.

Figure 5L:
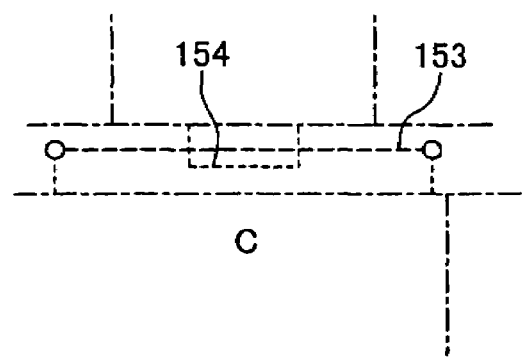

FIG. 5L shows a modification wherein the wiring layers are changed to shorten the distance between columns. A portion of the wiring 153 facing the wiring 154 is made of the second metal wiring layer instead of the first metal wiring layer. The second wiring layer 154 can be disposed crossing the wiring 154 of the first metal wiring layer. It is therefore possible to shorten the distance between adjacent columns. It is also possible to shorten the distance between adjacent cells by changing the wiring in a partial region of the cell.

Figure 5M:
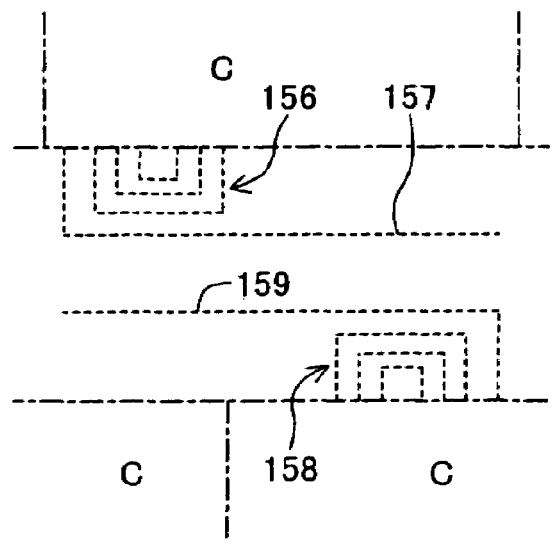

FIG. 5M shows wirings 156 and 158 of the same wiring layer of opposing cells disposed densely and wirings 157 and 159 disposed outside of the wirings 156 and 158. Although a coarse wiring region exists inside of the outer wirings 157 and 159, the distance between columns is constrained by the outer wirings. The distance between adjacent columns becomes long.

Figure 5N:
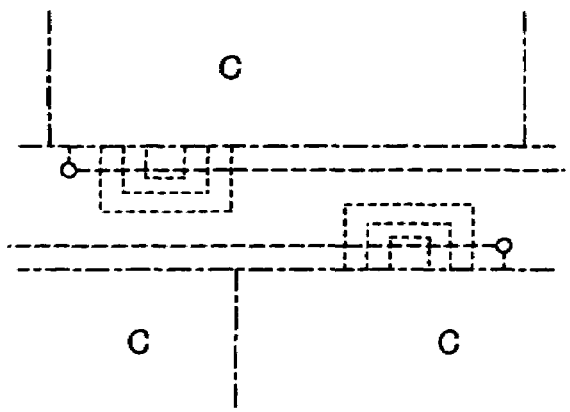

FIG. 5N shows a modification wherein the wiring layer of at least a portion of a wiring is changed to a different wiring layer to dispose the outer wirings 157 and 159 in an inner region. Since the outer wirings are moved to the inner regions, the upper column wirings form a coarse wiring region in the right region and the lower column wirings form a coarse wiring region in the left region. It is therefore possible to dispose the shape-variable wiring regions in the mutually fitting relation and the column pitch can be reduced greatly. In this example, if there is a coarse wiring region, it is checked whether this region can be moved outside, to thereby realize reduction in the column pitch (distance between columns).

Figure 6A:
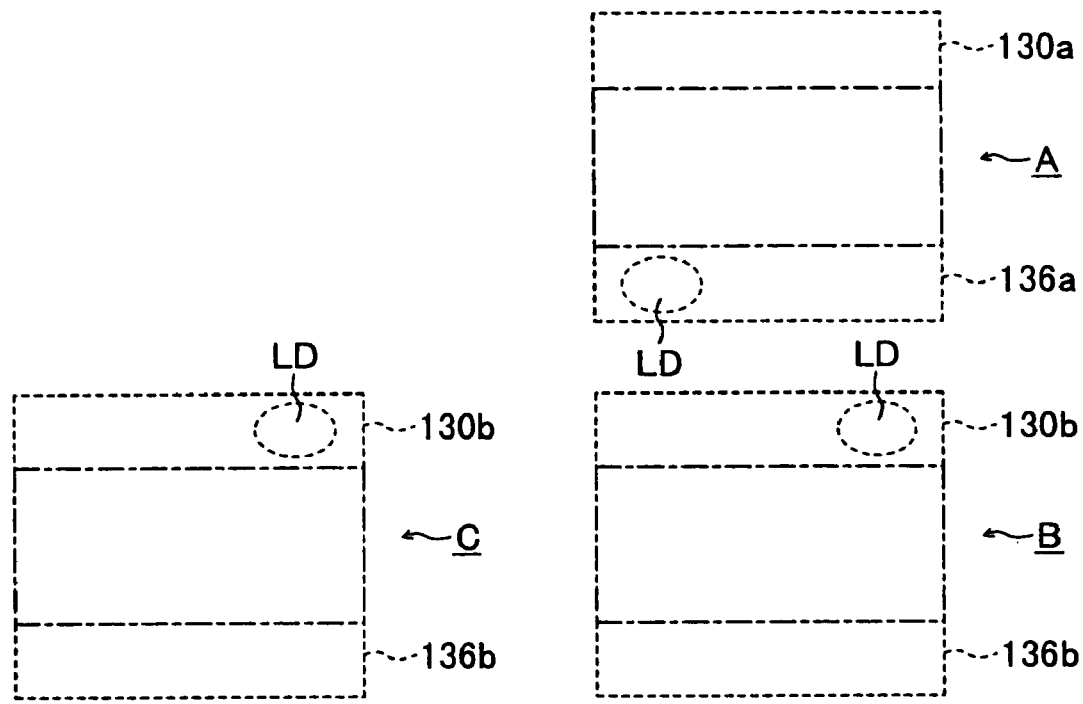
FIGS. 6A, 6B and 6C are schematic diagrams showing the coupling configuration of two cells.

FIG. 6A shows the layout of cell regions A and B reserved when Step SP8 was initially executed. The cell regions are disposed near to each other in the vertical direction, and a shape-variable wiring region 136*a* of the cell region A is disposed facing a shape-variable wiring region 130*b* of the cell region B. The density of the wiring pattern in the shape-variable wiring region 136*a* in a left area LD is "coarse". The density of the wiring pattern in the shape-variable wiring region 130*b* in a right area LD is "coarse".

Figure 6B:
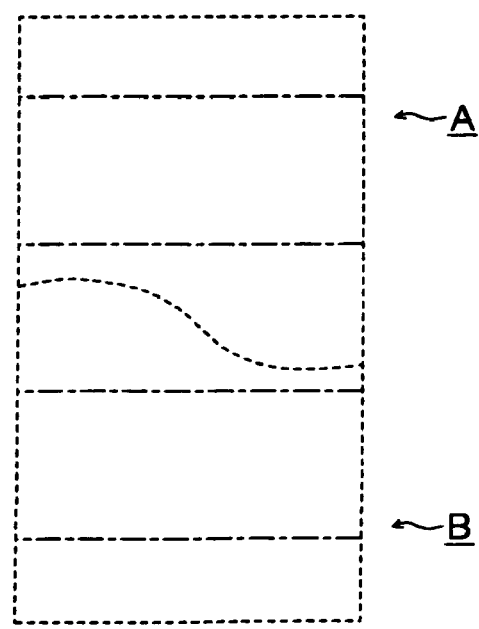

FIG. 6B shows the shape-variable regions 136*a* and 130*b* disposed in the mutually fitting relation by lowering the "height" of the region 136*a* in the left area and the "height" of the region 130*b* in the right area.

Figure 6C:
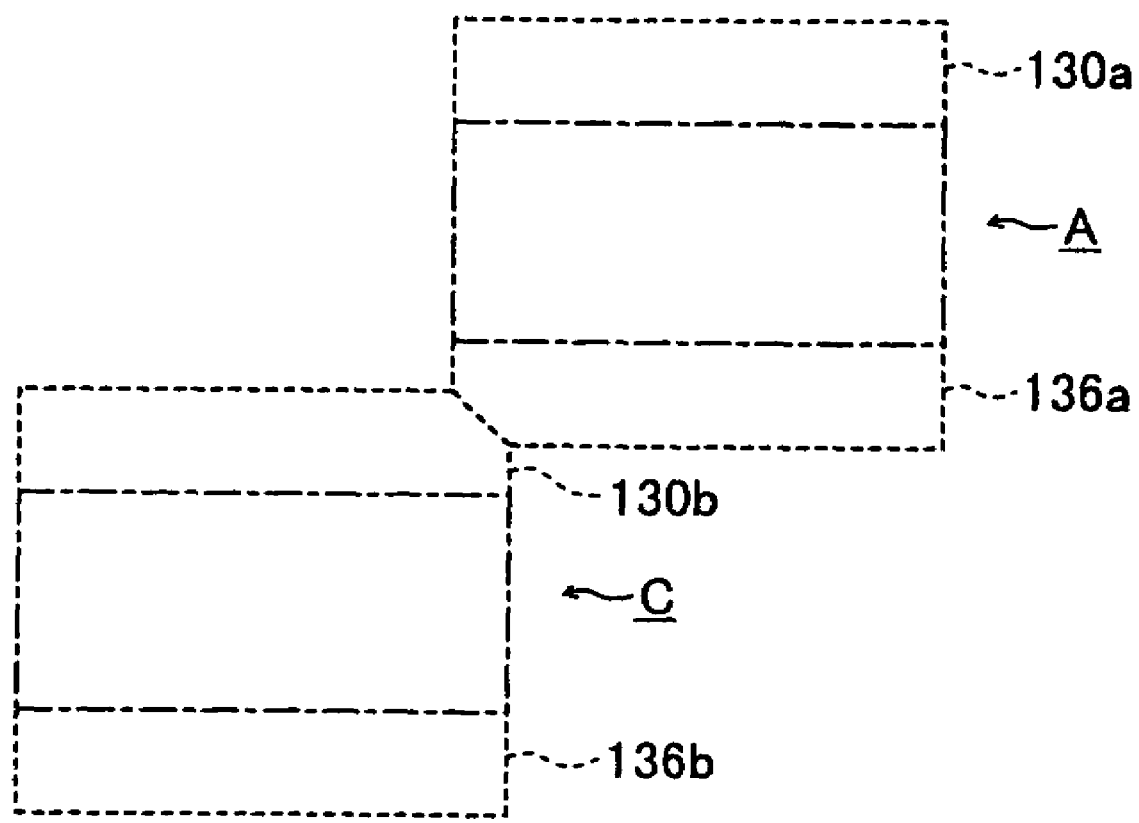

FIG. 6C shows a layout wherein the shape-variable wiring regions 130*a* and 136*b* are deformed by truncating the "coarse" wiring pattern density areas LD at the opposing corners of the cell regions A and C disposed obliquely near to each other. The occupied area can be reduced by shortening the cell distance by reducing the areas of the shape-variable wiring regions.

If the cell distance can be shortened by various modifications described above, Step SP10 is judged as "YES" and the flow returns to Step SP8 whereat the wiring pattern in the modified shape-variable region is determined again. Obviously, the layer constituting each wiring pattern (polysilicon layer 100, first metal layer 108, second metal layer 110 and the like) is determined again if necessary.

There is the case that the cell distance can be shortened further even if the modification is once performed. Therefore, the processes at Steps SP8 and SP10 can be repetitively executed so long as the cell distance between at least a pair of two cells can be shortened. If the cell distance cannot be shortened by using a prepared wiring change method, it is judged at Step SP10 as "NO" to terminate this routine.

After the wiring patterns for all cells are determined, a user performs a predetermined operation to output reticle patterns drawing the wiring pattern of each layer, from the laser drawing apparatus 26. A final integrated circuit product can be manufactured by processes including an etching process using a photoresist mask formed by the reticle mask.

The invention is not limited only to the above-described embodiment, but the following various modifications are possible.

In the above-described embodiment, the automatic layout wiring system is constituted of a computer and an application program running on the computer. Only this application program may be stored in a recording medium such as a CD-ROM and a flexible disk to distribute it directly or via a transmission path.

The shape-variable wiring region may be changed for each wiring layer. By changing the boundary between shape-variable wiring regions of adjacent cells for each wiring layer, the degree of freedom of the wiring layout can be increased so that the cell distance can be shortened further.

By changing the deflecting position of a wiring, the number of wirings or the like, the position of each wiring can be changed. If the wiring length becomes long by such change, an increase in parasitic capacitance may be limited to a predetermined value or smaller.

The present invention has been described in connection with the preferred embodiments. The invention is not limited only to the above embodiments. It will be apparent to those skilled in the art that other various modifications, improvements, combinations, and the like can be made.

I claim:

1. A method of laying out a semiconductor integrated circuit device comprising:
   (a) decomposing circuit data into cells, and reading cell data including configuration data and interconnection data;
   (b) grouping cells on a semiconductor substrate into a plurality of rows, each of said rows including a plurality of cells aligned along a direction of a row, each cell including active regions, shape-fixed wiring regions disposed over the active regions, and shape-variable wiring regions disposed outside the active regions and having height along a direction crossing a direction of said row;
   (c) designing a layout of wirings in said shape-fixed wiring region;
   (d) designing a layout of wirings in said shape-variable wiring region;
   (e) checking possible variations of wirings in said shape-variable wiring region, for a pair of adjacent rows of cells grouped in said step (b), which will produce shape-variable wiring regions of locally varied height capable of a mutually fitting configuration, and which can reduce the distance between said pair of adjacent rows; and
   (f) if there is a variation which can reduce the distance between said pair of adjacent rows, redesigning the layout of wirings in the shape-variable wiring region to realize mutually fitting shape-variable wiring regions.

2. The method of laying out a semiconductor integrated circuit device according to claim 1, further including: (g) repeating the steps of (e) and (f).

3. The method of laying out a semiconductor integrated circuit device according to claim 1, wherein said shape-variable wiring region in said step (b) has a rectangular shape of a fixed height, and the shape-variable wiring region in said steps (e) and (f) has locally variable height.

4. The method of laying out a semiconductor device according to claim 3, wherein said wirings are made of a plurality of wiring layers, and the shape-variable wiring region has locally variable height for each wiring layer.

5. The method of laying out a semiconductor integrated circuit device according to claim 1, wherein said step (e) checks density distribution of wirings in said shape-variable wiring region.

6. The method of laying out a semiconductor integrated circuit device according to claim 1, wherein said step (f) changes the order of wirings in the direction of height.

7. The method of laying out a semiconductor integrated circuit device according to claim 6, wherein said step (f) includes changing at least part of a wiring with a different wiring layer.

8. The method of laying out a semiconductor integrated circuit device according to claim 1, wherein the cell data is read from a standard cell library.

9. A method of designing a layout of a semiconductor integrated circuit device comprising:
   (a) decomposing circuit data into cells, and reading cell data including configuration data and interconnection data;
   (b) locating cells on a virtual semiconductor substrate into a plurality of rows, each of said rows including a plurality of cells aligned along a direction of a row, each cell including active regions, shape-fixed wiring regions disposed over the active regions, and shape-variable wiring regions disposed outside the active regions and having height along a direction crossing the direction of the row;
   (c) designing a layout of wirings in said shape-fixed wiring region;
   (d) designing a layout of wirings in said shape-variable wiring region;
   (e) checking possible variations of wirings in said shape-variable wiring region, for a pair of adjacent rows of cells located in step (b), which will produce shape-variable wiring regions of locally varied height capable of mutually fitting configuration, which can reduce the distance between said pair of adjacent rows; and
   (f) if there is a variation which can reduce the distance between said pair of adjacent rows, redesigning the layout of wirings in the shape-variable wiring region to realize mutually fitting shape-variable wiring regions.

10. The method of designing a layout of a semiconductor integrated circuit device according to claim 9, further including: (g) repeating the steps of (e) and (f).

11. The method of designing a layout of a semiconductor integrated circuit device according to claim 9, wherein said shape-variable wiring region in said step (b) has a rectangular shape of a fixed height, and the shape-variable wiring region in said steps (e) and (f) has locally variable height.

12. The method of designing a layout of a semiconductor integrated circuit device according to claim 11, wherein said wirings are made of a plurality of wiring layers, and the shape-variable wiring region has locally variable height for each wiring layer.

13. The method of designing a layout of a semiconductor integrated circuit device according to claim 9, wherein said step (e) checks density distribution of wirings in said shape-variable wiring region.

14. The method of designing a layout of a semiconductor integrated circuit device according to claim 9, wherein said step (f) changes the order of wirings in the direction of height.

15. The method of designing a layout of a semiconductor integrated circuit device according to claim 14, wherein said step (f) includes changing at least part of a wiring with a different wiring layer.

16. The method of designing a layout of a semiconductor integrated circuit device according to claim 9, wherein the cell data is read from a standard cell library.

17. A computer-readable medium having encoded thereon a computer-readable program code which when executed causes a computer to:
   (a) decompose circuit data into cells, and read cell data including configuration data and interconnection data;
   (b) group cells on a virtual semiconductor substrate into a plurality of rows, each of said rows including a plurality of cells aligned along a direction of a row, each cell including active regions, shape-fixed wiring regions disposed over the active regions, and shape-variable wiring regions disposed outside the active regions and having height along a direction crossing the direction of the row;
   (c) design a layout of wirings in said shape-fixed wiring region;

(d) design a layout of wirings in said shape-variable wiring region;

(e) check possible variations of wirings in said shape-variable wiring region, for a pair of adjacent rows of cells grouped in step (b), which will produce shape-variable wiring regions of locally varied height capable of mutually fitting configuration, which can reduce the distance between said pair of adjacent (f) if there is a variation which can reduce the distance between said pair of adjacent rows, redesign the layout of wirings in the shape-variable wiring regions.

18. The computer-readable medium according to claim 17, wherein the cell data is read from a standard cell library.

* * * * *